US007446003B2

(12) United States Patent
Moscatelli et al.

(10) Patent No.: US 7,446,003 B2
(45) Date of Patent: Nov. 4, 2008

(54) MANUFACTURING PROCESS FOR LATERAL POWER MOS TRANSISTORS

(75) Inventors: Alessandro Moscatelli, Como (IT); Claudia Raffaglio, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 74 days.

(21) Appl. No.: 11/413,961

(22) Filed: Apr. 27, 2006

(65) Prior Publication Data

US 2006/0261378 A1 Nov. 23, 2006

(30) Foreign Application Priority Data

Apr. 29, 2005 (EP) ................. 05425278.8

(51) Int. Cl.
*H01L 21/336* (2006.01)
*H01L 21/8238* (2006.01)

(52) U.S. Cl. ............... 438/286; 438/217; 257/E21.427

(58) Field of Classification Search ................ 438/217, 438/230, 286, 303, 283, 284, 592, 595; 257/E21.427, 257/E21.431–E21.435
See application file for complete search history.

(56) References Cited

U.S. PATENT DOCUMENTS

| 5,661,048 | A | * | 8/1997 | Davies et al. ............... 438/217 |
| 5,681,768 | A | * | 10/1997 | Smayling et al. ............. 438/301 |
| 6,001,710 | A | * | 12/1999 | Francois et al. ............. 438/454 |
| 6,017,798 | A | * | 1/2000 | Ilderem et al. .............. 438/286 |
| 6,046,473 | A | * | 4/2000 | Blanchard ................... 257/341 |
| 6,093,609 | A | * | 7/2000 | Chuang ....................... 438/286 |
| 6,107,160 | A | * | 8/2000 | Hebert et al. ................ 438/454 |
| 6,172,400 | B1 | * | 1/2001 | Ng et al. ..................... 257/343 |
| 6,744,117 | B2 | * | 6/2004 | Dragon et al. .............. 257/659 |
| 6,905,930 | B2 | * | 6/2005 | Shih .......................... 438/266 |
| 6,995,025 | B2 | * | 2/2006 | Hsu et al. ...................... 438/3 |
| 7,307,314 | B2 | * | 12/2007 | Babcock et al. ........ 257/E21.427 |
| 2001/0019869 | A1 | * | 9/2001 | Hsu .......................... 438/286 |
| 2002/0056887 | A1 | * | 5/2002 | Horstmann et al. ......... 257/508 |
| 2004/0110346 | A1 | * | 6/2004 | Tao ........................... 438/286 |
| 2005/0017298 | A1 | | 1/2005 | Xie et al. |
| 2005/0121726 | A1 | * | 6/2005 | Asada et al. ................ 257/368 |
| 2006/0017103 | A1 | * | 1/2006 | Szelag ....................... 257/335 |
| 2006/0261378 | A1 | * | 11/2006 | Moscatelli et al. .......... 257/244 |

FOREIGN PATENT DOCUMENTS

WO 01/11681 A1 2/2001

* cited by examiner

*Primary Examiner*—Walter L Lindsay, Jr.
(74) *Attorney, Agent, or Firm*—LIsa K. Jorgenson; Robert Iannucci; Seed IP Law Group PLLC

(57) ABSTRACT

A process manufactures power MOS lateral transistors together with CMOS devices on a semiconductor substrate. The process forms a lateral MOS transistor having a gate electrode on the semiconductor region, a source comprising a first highly doped portion aligned with the gate electrode and a drain comprising a lightly doped portion aligned with the gate electrode and a second highly doped portion included in the lightly doped portion. The process forms on the lightly doped portion, a protective layer of a first material; forms on the lateral MOS transistor, a dielectric layer of a second material selectively etchable with respect to the first material; forms, in the dielectric layer first, second, and third openings; and fills the openings with a conductive layer that forms drain and source contacts electrically connected to the first and second highly doped portions, and one electrical shield substantially aligned with the protective layer.

32 Claims, 2 Drawing Sheets

MANUFACTURING PROCESS FOR LATERAL POWER MOS TRANSISTORS

BACKGROUND OF THE INVENTION

1. Field of the Invention

The present invention relates to a process for manufacturing power MOS lateral transistors.

More specifically, the invention relates to a process for manufacturing shielded power MOS lateral transistors together with VLSI CMOS devices, on a same semiconductor substrate which comprises a semiconductor region of a first type of conductivity, the process comprising the following steps of:

forming, on said semiconductor region, at least one lateral MOS transistor which comprises a gate electrode projecting from said semiconductor region and being insulated therefrom by means of an insulating layer, a source region comprising a first highly doped portion of a second type of conductivity aligned with said gate electrode and a realized drain region comprising a first lightly doped portion aligned with said gate electrode and a second highly doped portion included in said first lightly doped portion, both of the second type of conductivity.

The invention particularly, but not exclusively, relates to a process for manufacturing shielded power MOS lateral transistors in VLSI CMOS technology and the following description is made with reference to this field of application by way of illustration only.

2. Description of the Related Art

As it is well known, high efficiency power discrete MOSFET lateral transistors integrated on a silicon semiconductor substrate are realized, for example, by means of MOSFET transistors of the drain extension or LDMOSFET (lateral double diffused MOSFET) type.

As shown in FIG. 1, an N-channel MOS transistor DE of the conventional drain extension type integrated on a semiconductor substrate having a semiconductor region 1*a* of the P type, wherein a body region 2*a* of the P type is realized, which is more doped than a semiconductor region 1*a* adjacent to a drift region 3*a* of the N− type.

Inside the body region 2*a*, a first implanted region 4*a* of the P+ type, being more doped than the adjacent body region 2*a*, and a second implanted region 5*a* of the N+ type are realized. In particular, such implanted regions 4*a* and 5*a* do not contact the drift region 3*a* and they realize the transistor DE source region.

Inside the drift region 3*a*, a third implanted region 6*a* of the N+ type is realized. In particular, the third implanted region 6*a* does not contact the body region 2*a* and it realizes, together with the drift region 3*a*, the transistor DE drain region.

On the semiconductor region 1*a*, between the drift region 3*a* and the second region 5*a*, a gate electrode 8*a* is realized, which is insulated from the semiconductor region 1*a* by means of an oxide layer 7*a*.

The gate electrode 8*a* comprises a polysilicon layer 9*a* overlapped by a silicide layer 10*a*. Dielectric spacers 11*a* are also provided on the side walls of the gate electrode 8*a*.

Once a premetal dielectric layer 12*a* has been formed on the whole device DE, contacts 13*a* and 14*a* are conventionally formed at the respective source and drain regions.

Recently, the need of reducing the feedback gate-drain capacitance Cgd of such discrete LDMOSFET devices is felt, improving at the same time the reliability thanks to the reduction of the hot carriers phenomenon. Such feedback gate-drain capacitance Cgd is generally made of three components: C1 due to the capacitance between the gate electrode and the drift region portion geometrically underlying the gate electrode, C2 due to the capacitance between the gate electrode and the portion of the drift region lying outside the gate electrode, and C3 due to the capacitance between the gate electrode and the drain metallic contact.

Moreover, it is known that the reduction of the MOSFET feedback capacitance allows to increase the high frequency gain, to improve the amplification unilaterally and to decrease the signal distortion. This advantage is particularly important in the radiofrequency power amplifiers for wireless applications, where, often, RF LDMOSFET transistors are used as amplification elements.

It is also known that a shielding electrode, in general connected to the source region, suitably placed between the drain region and the gate electrode, reduces such feedback capacitance, in particular its components C2 and C3. Its "field plate" effect, moreover, allows to reduce the electrical fields at the edge of the polysilicon layer forming the gate electrode towards the drain region, reducing the hot carriers phenomenon which could affect the component reliability.

A first solution to manufacture such a shielding electrode in a MOSFET device of the discrete type, is described in the international application no. WO 0111681 to Spectrian Inc.

In such device, as shown in FIG. 2, after having realized the doped regions 14, 16, 25 and 28 in the substrate 10 and the gate electrode 22 in the substrate 10, 12, a first dielectric layer 24 and a second dielectric layer 30 are deposited on the whole device. Thus, a first opening is realized in the second dielectric layer between the gate electrode and the drain region to realize the shield electrode 34. Subsequently, two openings are realized both in the first and in the second dielectric layer in correspondence with the source and drain terminals to realize the source and drain contacts 36, 38.

Although advantageous under several aspects, this solution is not compatible with the processes for realizing the VLSI CMOS transistors. In fact, the formation of the dedicated dielectric layer 24 to realize the shield 34, the realization of the openings in sequence in the premetal dielectric layers and the use of layers of different metalizations for the shield on one side and contacts on the other, is expensive and not simple to be realized during the standard procedures of the VLSI CMOS devices, especially in case shielded lateral MOSFET devices of reduced sizes are realized with VLSI technology. The presence of these additional technological steps could also introduce undesired electrical variations in the realized final VLSI CMOS devices.

A second solution, which provides to realize the shield metalization by means of the metalization layer forming the source metalization, with subsequent simplification and saving of a mask with respect to the previous solution, is described in the U.S. Pat. No. 6,744,117 to Motorola Inc.

In particular, as shown in FIG. 3, after having realized the source 19 and drain 20 regions and the sinker region 21 in the substrate 11 and the gate electrode 15 on such substrate 11, an intermetal dielectric layer 23 is deposited, wherein openings are realized on the source 19 and drain 20 regions. A metallic layer is formed on the device to form a metallic shield 27, the first drain contact 26 and a bus 29.

Although meeting the aim, even this solution is not exempt from drawbacks.

The efficiency of the shielding and "field plate" effect of the metallic shield 27 however depends on the proximity of the same with respect to the drain region 20. A decrease of the thickness of the intermetal dielectric layer 23 to improve the shield efficiency would inevitably imply a capacitance increase of the metalization layer towards the gate electrode 15 with subsequent reduction of the device cut-off frequency.

Then, in case one would like to use a similar approach in a VLSI CMOS platform where the premetal and intermetal dielectrics are perfectly planarized the shielding effect of the metalization layer would be lost due to the great distance of the metallic shield 27 from the substrate 11.

To overcome some of these drawbacks, it is proposed to realize a polysilicon shield as described in the U.S. Pat. Nos. 6,107,160 and 6,172,400 to Spectrian Corporation.

However, in the VLSI CMOS platforms, or more in general for high performance MOSFET (high capacitance in current and specific transconductance), due to the reduced gate oxide thickness, the polysilicon shield can introduce undesired effects of almost saturation due to the strong modulation of the drain drift region and it can be inefficient in reducing the electrical fields. In particular, for solving these drawbacks U.S. Pat. No. 6,172,400 provides the use of more complex and expensive structures with thicker "bump oxide" below the shield gate electrode.

Moreover, by using this kind of polysilicon shield, which takes substantially "coplanar" conformation, it is necessary to consider the limits it imposes on the smaller device sizes which can be realized (and thus also on its series resistance), due to the simultaneous lithographic limits of width and separation between the two polysilicon layers forming respectively the gate electrode and the shield itself. Moreover, the complications should be considered which can derive from the self-aligned silicidification process of the active area layers, and i.e., of all the substrate portions which are not covered by a field oxide layer, which is frequently used in the platforms VLSI CMOS.

In fact, to obtain VLSI CMOS structures with high density and with high performance, the manufacturing processes of such devices are characterised by the following steps:
  formation of gate oxide layers having reduced thickness, reduced sizes of the device,
  self-aligned silicidification of polysilicon layers and active areas,
  planarization of the premetal and intermetal dielectric layers,
  "plug" (in general of tungsten) as contacts on the silicon and polysilicon and as path between the different metalization layers.

However, such standard process steps are not easily compatible with the process steps to realize the previously described discrete power devices.

BRIEF SUMMARY OF THE INVENTION

One embodiment of the present invention is a process for manufacturing MOSFET power devices together with VSLI CMOS devices, having such characteristics as to allow not to introduce process steps neither supplementary nor with modifications being particularly complex or expensive with respect to a standard VLSI CMOS process, overcoming the limits still limiting the processes realized according to the prior art.

One embodiment of the present invention realizes a protection dielectric layer on the drift region of the MOSFET device, a second premetal dielectric layer on the whole device and forms, in a single step, some openings aligned with the source and drain regions until the substrate is exposed and an opening aligned with the drift region exposing the protection dielectric layer.

The characteristics and advantages of the device according to the invention will be apparent from the following description of an embodiment thereof given by way of indicative and non limiting example with reference to the annexed drawings.

BRIEF DESCRIPTION OF THE DRAWINGS

In such drawings.

DETAILED DESCRIPTION OF THE INVENTION

With reference to such figures, a process for manufacturing power MOS lateral transistors is described.

The process steps described hereafter do not form a complete process flow for manufacturing of integrated circuits. The present invention can be put into practice together with the techniques for manufacturing the integrated circuits currently used in the field, and only those commonly used process steps are included which are necessary for the comprehension of the present invention.

The figures showing perspective views of portions of an integrated circuit during the manufacturing are not drawn to scale, but they are instead drawn in such a way as to show the important characteristics of the invention.

Figure 1:
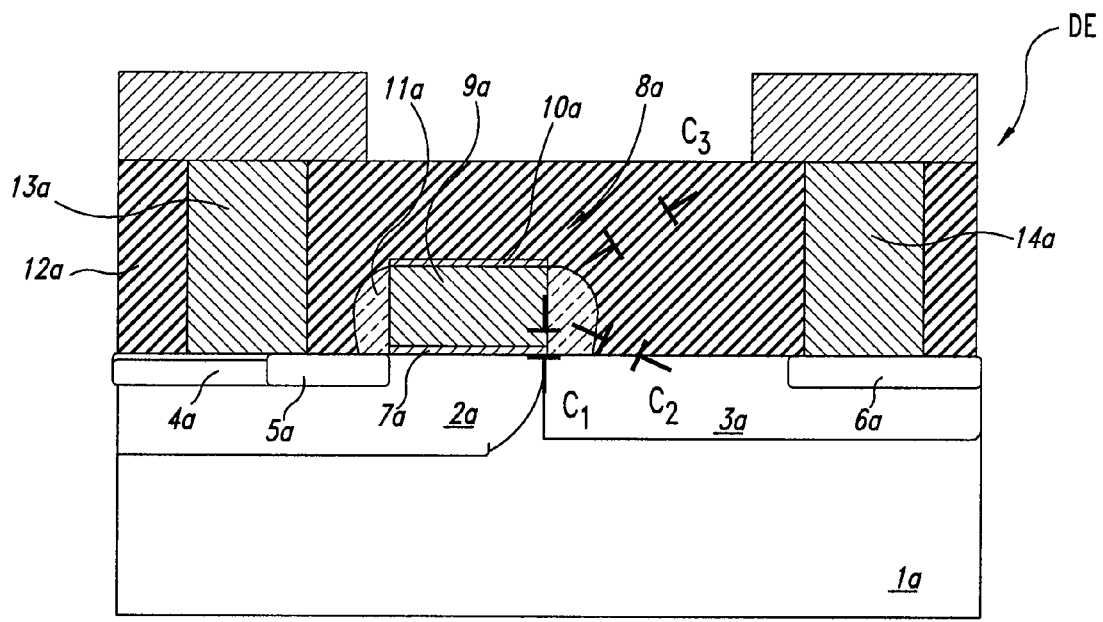
FIG. 1 shows a section view of a first embodiment of a MOS transistor of the Drain extension type realized according to the prior art.
Figure 2:
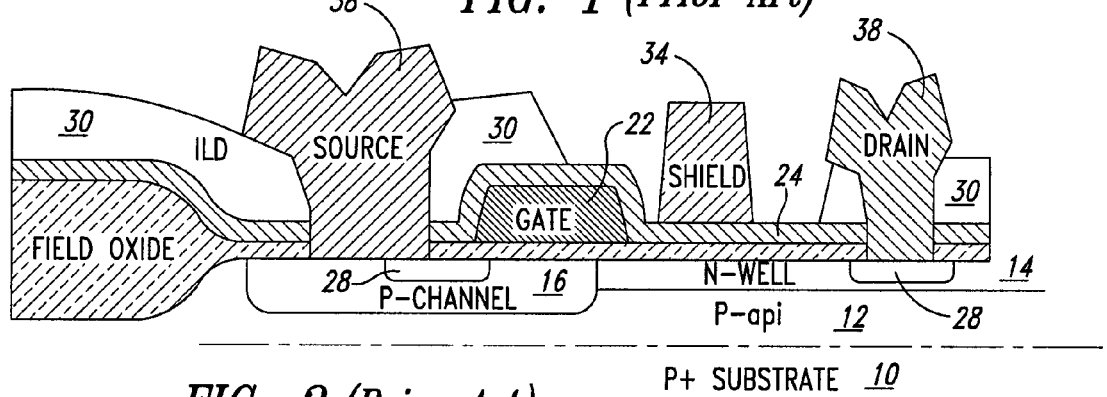
FIG. 2 shows a section view of a second embodiment of a MOS transistor of the Drain extension type realized according to the prior art.
Figure 3:
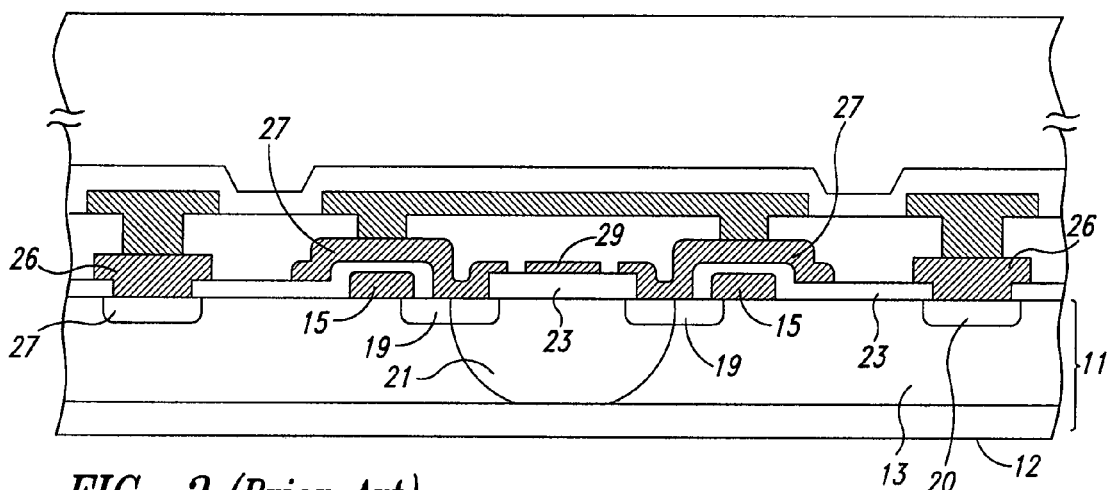
FIG. 3 shows a section view of a third embodiment of a MOS transistor of the Drain extension type realized according to the prior art.
Figure 4:
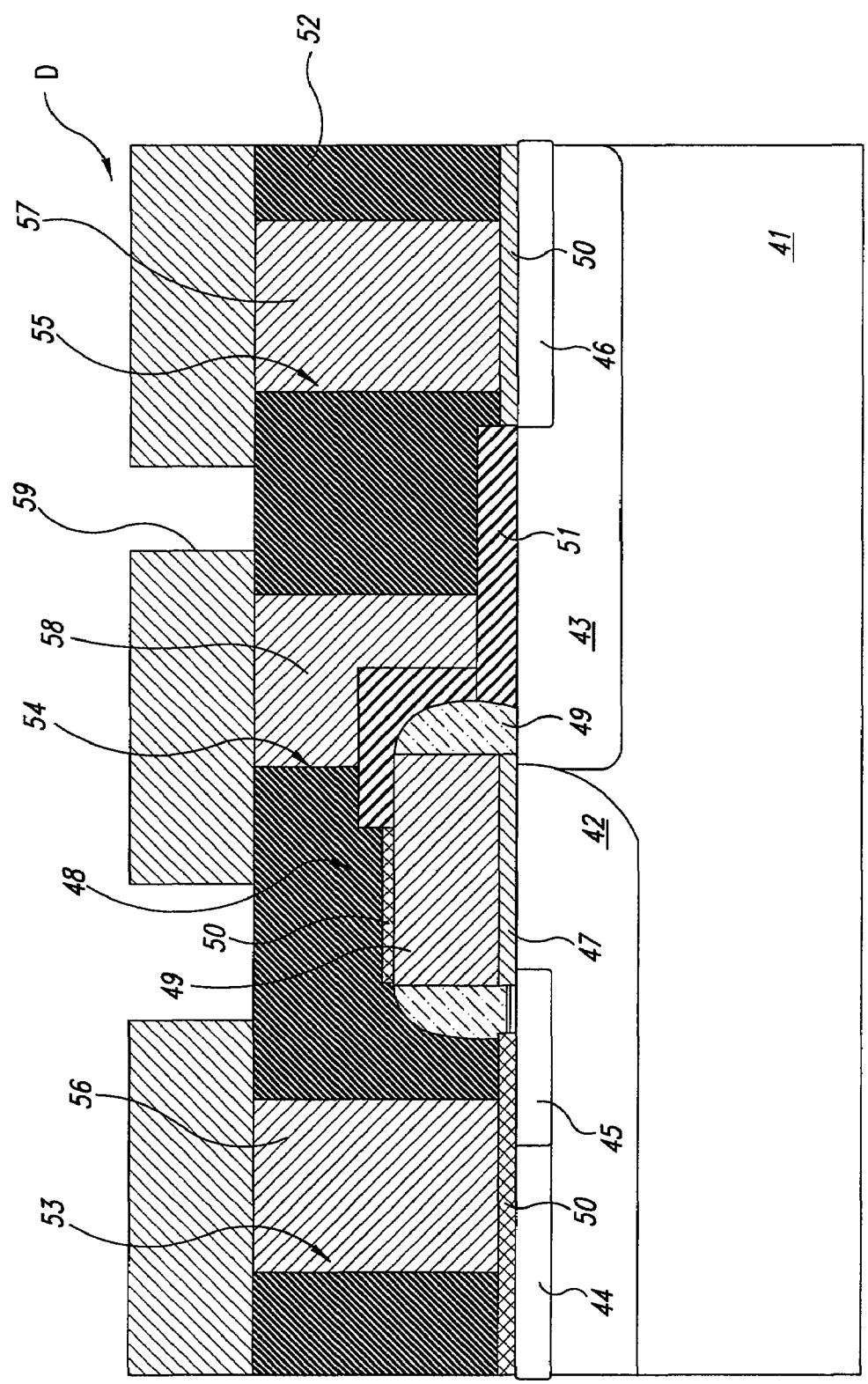
FIG. 4 shows a section view of a MOS transistor of the Drain extension type realized according to the invention.

In particular, with reference to FIG. 4, an N-channel lateral MOS transistor D is described of the conventional drain extension type integrated in a semiconductor substrate which comprises a semiconductor region 41 for example of the P type, wherein a body region 42 is realized being more doped than the semiconductor region 41 for example of the P type adjacent to a lightly doped drift region 43 for example of the N− type.

Inside the body region 42, a first implanted region 44 being more doped than the adjacent body region 42 for example of the P type and a second implanted highly doped region 45 for example of the N+ type are realized. In particular, these first and second implanted regions 44, 45 do not contact the drift region 43 and both of them realize the transistor D source region.

Inside the drift region 43, a third implanted highly doped region 46 for example of the N+ type is realized. In particular, the third implanted region 46 does not contact the body region 42 and it realizes, together with the drift region 43, the transistor D drain region.

On the semiconductor region 41 between the drift region 43 and the second implanted region 45 the gate electrode 48 is realized, which comprises a polysilicon layer 49, and is insulated from the semiconductor region 41 by means of an insulating layer 47, for example of oxide. Advantageously, dielectric spacers 49' are provided on the side walls of the gate electrode 48.

A protection dielectric layer 51 is formed on the drift region 43 and advantageously on a portion of the gate electrode 48 on the side of such drift region 43.

Then a silicide layer 50 is realized on the transistor D portions left exposed from the dielectric layer 51. Therefore, it results that the regions 44, 45, 46 and an portion of the gate electrode 48 which is not covered by the protection dielectric layer 51 are overlapped by the silicide layer 50.

Advantageously, the protection dielectric layer 51 is made of an oxide layer, or of a nitride layer, or of a double oxide and nitride layer.

This protection dielectric layer 51 can advantageously be the same layer used in the standard VLSI CMOS platforms such as "silicide protection" to inhibit the self-aligned silicidification of active areas and conductive layers in the components requiring it.

In the case of a drain extension MOS or LDMOS transistor as the one just described in fact the drift region 43 should not be silicidificated to sustain the applied high voltage, allowing the emptying of the carriers.

The greater the chosen thickness of the protection dielectric layer 51 is, the lower the shield effect and thus the benefit on the voltage seal and on the reduction of the feedback capacitance is, but lower is the modulation of the drift region 43 is and thus the "on" resistance of the transistor D. Advantageously, it is possible to find, according to the application, a thickness of the dielectric layer 51 which optimizes the above cited electrical parameters. The choice of such thickness does not induce significant electrical variations on the other components integrated in the same technological platform, the protection dielectric layer 51 "silicide protection" being electrically non-active. By way of indication, the thickness of the protection dielectric layer 51 can vary from 10 nm to 100 nm, whereas its lateral dimensions from 0.1 µm to 10 µm.

A premetal dielectric layer 52 is thus formed on the whole transistor D, which is possibly planarized by means of CMP (chemical mechanical polishing).

At this point of the process, openings 53, 54, and 55 are realized simultaneously in the premetal dielectric layer 52 to expose portions of the first 44, second 45, and third 46 implanted regions and a portion of the protection dielectric layer 51. The openings 53, 55 are thus substantially aligned respectively with the second 45 and with the third 46 implanted regions, whereas the opening 54 is substantially aligned with the drift region 43.

Advantageously, further openings can be realized in the premetal dielectric layer 52 being suitably spaced for the whole length of the drift region simultaneously with the openings 53, 54, and 55.

Such openings 53, 54, and 55 in the dielectric layer 52 and possible further openings realized in the dielectric layer 52 are thus filled in by a conductive layer, for example metallic, to respectively realize source and drain contacts 56 and 57 and an electric shield 58.

If more openings are realized in the premetal dielectric layer 52 along the drift region 43, the final electric shield 58 comprises more contacts which fill in these openings and are connected to each other in parallel, obtaining a greater shielding effect.

Advantageously, the etching step which realizes the openings 53, 54, and 55 in the dielectric layer 52 removes, in a selective way, the premetal dielectric layer, without damaging the protection dielectric layer 51.

This result can be advantageously realized both by calibrating in a suitable way the etching chemistry of the protection dielectric layer 51 and by suitably choosing the materials and thickness constituting this protection dielectric layer 51. In this way, the step of filling in the source and drain contacts 56 and 57, with one layer for example of tungsten, allows the normal contacting of the polysilicon and silicon terminals of the transistor D (gate polysilicon and silicon of the source and drain active areas), but it advantageously stops on the protection dielectric layer 51 forming the desired electric shield 58, which is then suitably connected to a first metalization level 59.

Advantageously, for a greater efficiency of the electric shield 58, the opening 55 on the protective dielectric layer 51 is defined as stripe, i.e., with a different shape with respect to that of the contacts conventionally realized as plug with squared section.

In particular, the electric shield 58 on the protection dielectric layer 51 has the shape of a sufficiently narrow rectangle, for example <1 µm, so as to maintain the pitch and thus the transistor D sizes reduced, but sufficiently long as to shield along the whole direction of the transistor D length "W", for example >10 µm. At the same time, to maintain the compatibility with the CMOS VLSI devices, the openings 53 and 55 realized on active area and polysilicon, have reduced uniform sizes compatible with the technology used (in general squared with side lower than 0.5 µm).

Nothing prevents the electric shield 58 from being realized on the dielectric layer 51 with the same sizes of the source and drain contacts 56 and 57.

Thus, the step of opening the contacts 56, 57, and 58 exhibits a double unevenness relative to the premetal dielectric layer 52 and to the form factor of such openings which has never been realized, as in the present invention, in the process steps for manufacturing devices in a CMOS VLSI technology.

The process also has the advantage that the shield 58 is of reduced size and which can be reduced in step with the lithographic scaling, of being extremely efficient from the electrical point of view, as well as highly flexible from the viewpoint of the choice of the materials and of the relative thickness according to the application.

Moreover, in the case wherein the protection dielectric layer 51 covers part of the gate electrode 48, it is advantageously possible to realize the electric shield 58 substantially aligned or also partially overlapped to such gate electrode 48. Such embodiment not only allows to have a greater alignment tolerance between the various layers and elements composing the transistor D, but also to possibly obtain a shield 58 being closer to the gate electrode, particularly advantageous condition when a greater shielding effect is to be obtained or when the sizes of the device and of the drift region 43 are particularly reduced (for example with low voltage components).

Thus, the position of the shield 58 (or of more contacts connected in parallel and forming the shield) on the drift region 43 and its position with respect to the gate electrode 48 can be advantageously determined according to the application and to the parameters which are to be optimized.

In conclusion, the process described above is innovative both with respect to the realization of the discrete power devices and with respect to the conventional devices realized in CMOS VLSI technologies. With these technologies in fact the contacts are opened, with conventional and thus fixed modes, always in regions in which the premetal dielectric layer is uniform, exactly because the required sizes and tolerances, in general lower than 0.5 µm, need homogeneous and controlled etchings. In the process described above with respect to FIG. 4 instead the premetal dielectric layer 52 wherein the contacts are opened is not uniform since it is formed on the protection dielectric layer 51 which covers only one small portion of the device. Moreover, the shield 58 on the protection dielectric layer 11, on the side of the transistor D drain region, advantageously has, as already said, a different form with respect to that used to contact active areas and polysilicon so as to fully perform the shielding action. Such solutions, although having never been adopted up to now in the realization of VLSI CMOS devices as described, are however perfectly compatible with such technology.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A process for manufacturing a shielded power MOS lateral transistor on a semiconductor substrate which comprises a semiconductor region of a first type of conductivity, the process comprising the following steps of:

forming, on said semiconductor region, at least one lateral MOS transistor which comprises a gate electrode projecting from said semiconductor region and insulated from said semiconductor region by an insulating layer, a source region comprising a first highly doped portion of a second type of conductivity aligned with said gate electrode and a drain region comprising a first lightly doped portion aligned with said gate electrode and a second highly doped portion included in said first lightly doped portion, both of the second type of conductivity;

forming, on at least said first lightly doped portion, a protective layer of a first type of material;

forming, on said whole lateral MOS transistor, a dielectric layer of a second type of material that is selectively etchable with respect to said first type of material;

forming, in a single step, in said dielectric layer:
a first opening to expose at least one portion of said first highly doped portion,
a second opening to expose at least one portion of said second highly doped portion, and
a third opening to expose a portion of said protective layer; and filling in said first, second and third openings by a conductive layer so as to form respective drain and source contacts electrically connected respectively to said first and second highly doped portions, and one electrical shield substantially aligned with said protective layer.

2. The process according to claim 1, wherein said third opening has a different shape than that of said first and second openings.

3. The process according to claim 2, wherein said third opening has a rectangular shape.

4. The process according to claim 1, wherein said protective layer is made of a dielectric layer.

5. The process according to claim 4, wherein said protective layer is made of an oxide layer or of a nitride layer.

6. The process according to claim 4, wherein said protective layer is made of a double oxide and nitride layer.

7. The process according to claim 1, wherein a plurality of openings are opened in said dielectric layer, simultaneously with said first, second and third openings to expose portions of said protective layer.

8. The process according to claim 1, wherein said protective layer has a thickness that varies within a range from 10 nm to 100 nm, and has lateral sizes that are comprised in a range varying from 0.1 μm to 10 μm.

9. The process according to claim 1, wherein said protective layer is also formed on a portion of said gate electrode.

10. The process according to claim 9, wherein said electric shield is substantially aligned with said gate electrode and is insulated from the gate electrode by said protective layer which is formed on said portion of said gate electrode.

11. The process according to claim 9, wherein said electric shield partially overlaps said gate electrode and is insulated from this the gate electrode by said protective layer which is formed on said portion of said gate electrode.

12. The process according to claim 1, further comprising forming silicide layers on portions of the transistor not covered by said protective layer.

13. A process, comprising:

forming a lateral MOS transistor that comprises an insulated gate electrode positioned on semiconductor region, a source region comprising a first highly doped portion of the semiconductor region and a drain region comprising a first lightly doped portion of the semiconductor region and a second highly doped portion included in the first lightly doped portion;

forming on the first lightly doped portion, a protective layer of a first material;

forming on the lateral MOS transistor a dielectric layer of a second material that is selectively etchable with respect to the first material;

simultaneously forming in the dielectric layer first, second, and third openings, the first opening being aligned with a portion of the first highly doped portion, the second opening being aligned with a portion of the second highly doped portion, and the third opening being aligned with a portion of the protective layer;

forming conductive drain and source contacts in the first and second openings, respectively, the drain and source contacts being electrically connected respectively to the first and second highly doped portions; and forming in the third opening a conductive electrical shield aligned with the protective layer.

14. The process according to claim 13, wherein the third opening has a different shape than that of the first and second openings.

15. The process according to claim 13, wherein the protective layer is made of a dielectric layer.

16. The process according to claim 13, further comprising:
opening a plurality of openings in the dielectric layer, simultaneously with the first, second and third openings, to expose portions of the protective layer; and
filling the plurality of openings with a conductive layer used in forming the shield.

17. The process according to claim 13, wherein the protective layer has a thickness that varies within a range from 10 nm to 100 nm, and has lateral sizes that are comprised in a range varying from 0.1 μm to 10 μm.

18. The process according to claim 13, wherein the protective layer is also formed on a portion of the gate electrode.

19. The process according to claim 18, wherein the electric shield is substantially aligned with the gate electrode and is insulated from the gate electrode by the protective layer which is formed on the portion of the gate electrode.

20. The process according to claim 18, wherein the electric shield partially overlaps the gate electrode and is insulated from this the gate electrode by the protective layer which is formed on the portion of the gate electrode.

21. The process according to claim 1, wherein the conductive layer forming the electrical shield directly contacts the protective layer.

22. The process according to claim 13, wherein the conductive electrical shield directly contacts the protective layer.

23. The process according to claim 13, wherein said protective layer is made of a double oxide and nitride layer.

24. A process, comprising:
  forming a lateral MOS transistor that comprises an insulated gate electrode positioned on semiconductor region, a first highly doped portion of the semiconductor region, a first lightly doped portion of the semiconductor region, and a second highly doped portion included in the first lightly doped portion;
  forming on the first lightly doped portion, a dielectric protective layer of a first material;
  forming on the lateral MOS transistor a dielectric layer of a second material that is selectively etchable with respect to the first material;
  simultaneously forming first, second, and third openings in the dielectric layer by etching the dielectric layer, the first opening being aligned with a portion of the first highly doped portion, the second opening being aligned with a portion of the second highly doped portion, and the third opening exposing a portion of the protective layer;
  forming conductive first and second contacts in the first and second openings, respectively, the first and second contacts being electrically connected respectively to the first and second highly doped portions; and
  forming in the third opening a conductive electrical shield in contact with the protective layer.

25. The process according to claim 24, wherein the third opening has a different shape than that of the first and second openings.

26. The process according to claim 24, wherein said protective layer is made of a double oxide and nitride layer.

27. The process according to claim 24, further comprising:
  exposing portions of the protective layer by opening a plurality of openings in the dielectric layer, simultaneously with the first, second and third openings; and
  filling the plurality of openings with a conductive layer used in forming the shield.

28. The process according to claim 24, wherein the protective layer has a thickness that varies within a range from 10 nm to 100 nm, and has lateral sizes that are comprised in a range varying from 0.1 µm to 10 µm.

29. The process according to claim 24, wherein the protective layer is also formed on a portion of the gate electrode.

30. The process according to claim 29, wherein the electric shield is substantially aligned with the gate electrode and is insulated from the gate electrode by the protective layer which is formed on the portion of the gate electrode.

31. The process according to claim 29, wherein the electric shield partially overlaps the gate electrode and is insulated from this the gate electrode by the protective layer which is formed on the portion of the gate electrode.

32. The process according to claim 24, wherein said protective layer is made of a double oxide and nitride layer.

* * * * *